(12) United States Patent
Igarashi

(10) Patent No.: US 8,657,112 B2
(45) Date of Patent: Feb. 25, 2014

(54) BACK PROTECTIVE COVER FOR TABLET DEVICE

(75) Inventor: Katsushi Igarashi, Tokyo (JP)

(73) Assignee: Power Support Co., Ltd., Tokyo (JP)

( * ) Notice: Subject to any disclaimer, the term of this patent is extended or adjusted under 35 U.S.C. 154(b) by 0 days.

(21) Appl. No.: 13/579,793

(22) PCT Filed: May 24, 2012

(86) PCT No.: PCT/JP2012/063262
§ 371 (c)(1),
(2), (4) Date: Aug. 17, 2012

(87) PCT Pub. No.: WO2012/165271
PCT Pub. Date: Dec. 6, 2012

(65) Prior Publication Data
US 2013/0099636 A1  Apr. 25, 2013

(30) Foreign Application Priority Data

Jun. 3, 2011  (JP) .............................. 2011-003137U

(51) Int. Cl.
*B65D 85/00*  (2006.01)

(52) U.S. Cl.
USPC ........................................ 206/320; 312/223.1

(58) Field of Classification Search
USPC ................. 206/320; 320/103, 114; 312/223.1
See application file for complete search history.

(56) References Cited

U.S. PATENT DOCUMENTS

| | | | |
|---|---|---|---|
| 2003/0150756 A1* | 8/2003 | Kajiya | 206/320 |
| 2005/0247584 A1* | 11/2005 | Lu | 206/320 |
| 2007/0152633 A1* | 7/2007 | Lee | 320/114 |
| 2007/0227923 A1* | 10/2007 | Kidakarn | 206/320 |
| 2009/0015192 A1* | 1/2009 | Sheu | 320/103 |
| 2009/0314400 A1* | 12/2009 | Liu | 150/165 |
| 2010/0258463 A1* | 10/2010 | Yang et al. | 206/320 |
| 2010/0294683 A1* | 11/2010 | Mish et al. | 206/320 |
| 2011/0013347 A1 | 1/2011 | Kinjou | |
| 2011/0221319 A1* | 9/2011 | Law et al. | 312/325 |
| 2011/0290687 A1* | 12/2011 | Han | 206/320 |
| 2012/0012483 A1* | 1/2012 | Fan | 206/320 |
| 2012/0069502 A1* | 3/2012 | Lauder et al. | 361/679.01 |

FOREIGN PATENT DOCUMENTS

| | | |
|---|---|---|
| JP | 2011-022769 A | 2/2011 |
| JP | 3168090 U | 6/2011 |
| JP | 3168104 U | 6/2011 |

OTHER PUBLICATIONS

Written Opinion of the International Searching Authority mailed Jul. 17, 2012, as issued in International Patent Application No. PCT/JP2012/063262, filed May 24, 2012.

\* cited by examiner

*Primary Examiner* — Steven A. Reynolds
*Assistant Examiner* — Ernesto Grano
(74) *Attorney, Agent, or Firm* — Maier & Maier, PLLC

(57) ABSTRACT

A back protective cover for a tablet device is provided which is capable of preventing a touch-screen cover from coming off the tablet device. According to the present invention, a back protective cover which covers a back of a tablet device is provided, the back protective cover comprising a separation preventing section configured to cover an attaching/detaching section of a touch-screen cover of a detachable type, the touch-screen cover covering a touch screen of the tablet device, so as to prevent separation between the touch-screen cover and the tablet device.

2 Claims, 2 Drawing Sheets

Sectional View at A-A

Enlarged View of Region B

BACK PROTECTIVE COVER FOR TABLET DEVICE

RELATED APPLICATIONS

This application is the U.S. national stage application which claims priority under 35 U.S.C. §371 to International Patent Application No.: PCT/JP2012/063262, filed on May 24, 2012, which claims priority under 35 U.S.C. §119, to Japanese Patent Application No.: 2011-003137U, filed Jun. 3, 2011, the disclosures of which are incorporated by reference herein their entireties.

FIELD OF THE INVENTION

This invention is related to a back protective cover for a tablet device.

BACKGROUND ART

One of the accessories for a tablet device placed on the market by Apple Inc. is a touch-screen cover which can be attached to and detached from the tablet device by means of a built-in magnet and can protect a touch screen of the tablet device. Further, the touch-screen cover functions as a keyboard stand when folded, and thus, is very convenient.

SUMMARY OF THE INVENTION

Problems to be Solved by the Invention

The above-mentioned touch-screen cover is very convenient as noted above, however, the inventor of the present invention has found, while using it, that the touch-screen cover sometimes comes off the tablet device when grasping only the touch-screen cover and lifting it. In order to prevent the problem of coming off of the touch-screen cover, making the magnet more powerful or fixing the touch-screen cover to the tablet device with an adhesive or the like might be effective. However, since one of the attractive features of the touch-screen cover is that it can be easily detached when it is not needed, making the touch-screen cover difficult to come off by such methods will detract the attractive feature of the touch-screen cover.

Such a problem arises not only in the combination of the tablet device made by Apple Inc. and the above-mentioned touch-screen cover for this tablet device but also in a combination of a tablet device other than the tablet device made by Apple Inc. and a touch-screen cover attachable to and detachable from this tablet device.

The present invention is made in view of such a circumstance and provides a back protective cover for a tablet device which can prevent a touch-screen cover from coming off the tablet device.

Means to Solve the Problem

According to the present invention, a back protective cover which covers a back of a tablet device is provided, the back protective cover comprising a separation preventing section which is configured to cover an attaching/detaching section of a touch-screen cover of a detachable type, the touch-screen cover covering a touch screen of the tablet device, so as to prevent separation between the touch-screen cover and the tablet device.

While a back protective cover is sometimes attached to a back of a tablet device in order to prevent a casing of the tablet device from being scratched, the inventor of the present invention has found that a problem of coming off of a touch-screen cover can be prevented by using a back protective cover that is provided with a separation preventing section shaped to cover an attaching/detaching section used in attaching the touch-screen cover to the tablet device, and has completed the invention.

EMBODIMENTS FOR CARRYING OUT THE INVENTION

Hereafter an embodiment of the present invention will be described with reference to FIGS. 1 to 3. The following embodiment is only for illustrative purposes and the scope of the present invention is not limited to the one illustrated by the following embodiment.

Figure 1:
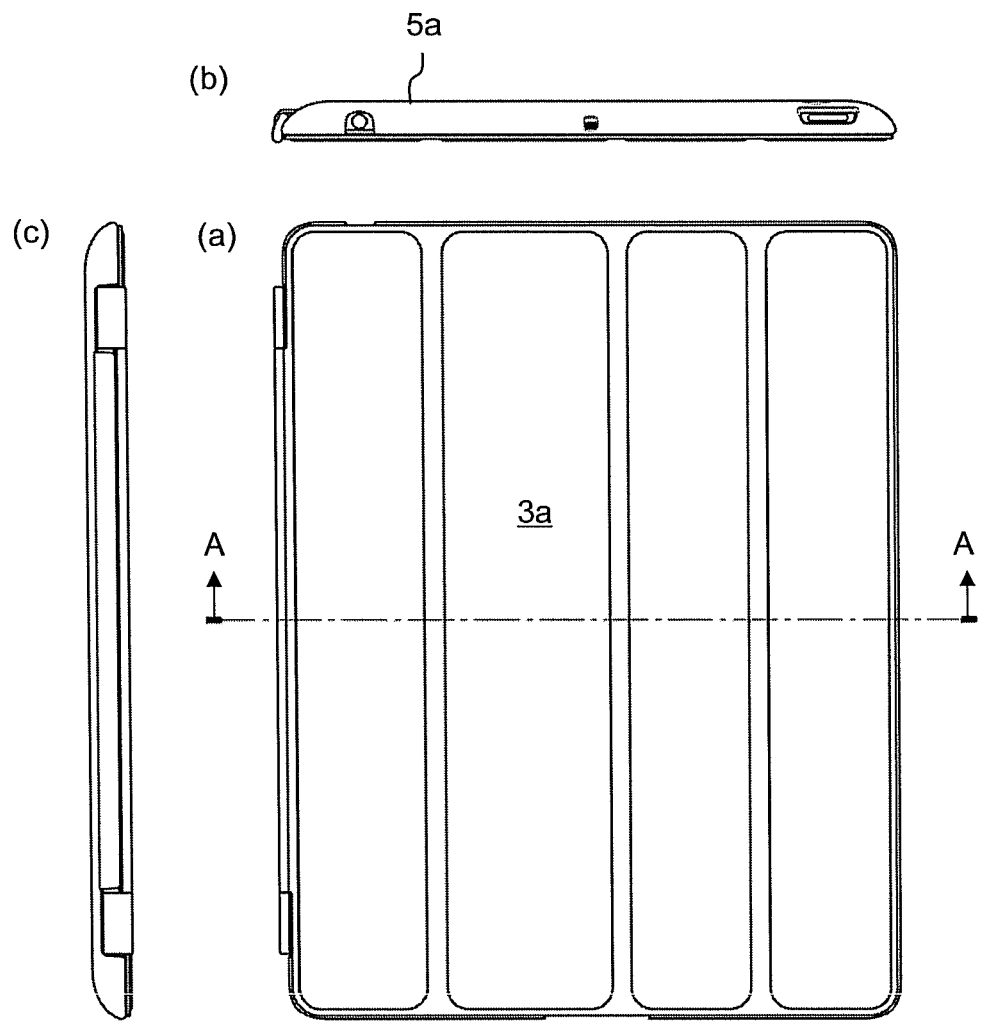
FIG. 1 shows a state in which a back protective cover according to an embodiment of the present invention is attached to a tablet device to which a touch-screen cover has been attached, where (a) is a plan view, (b) is a back view and (c) is a side view.
Figure 2:
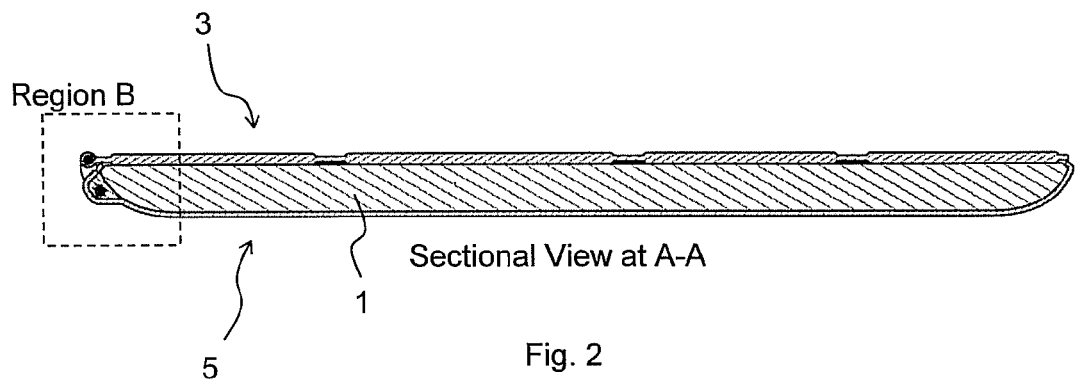
FIG. 2 is a sectional view taken along line A-A in FIG. 1(a).
Figure 3:
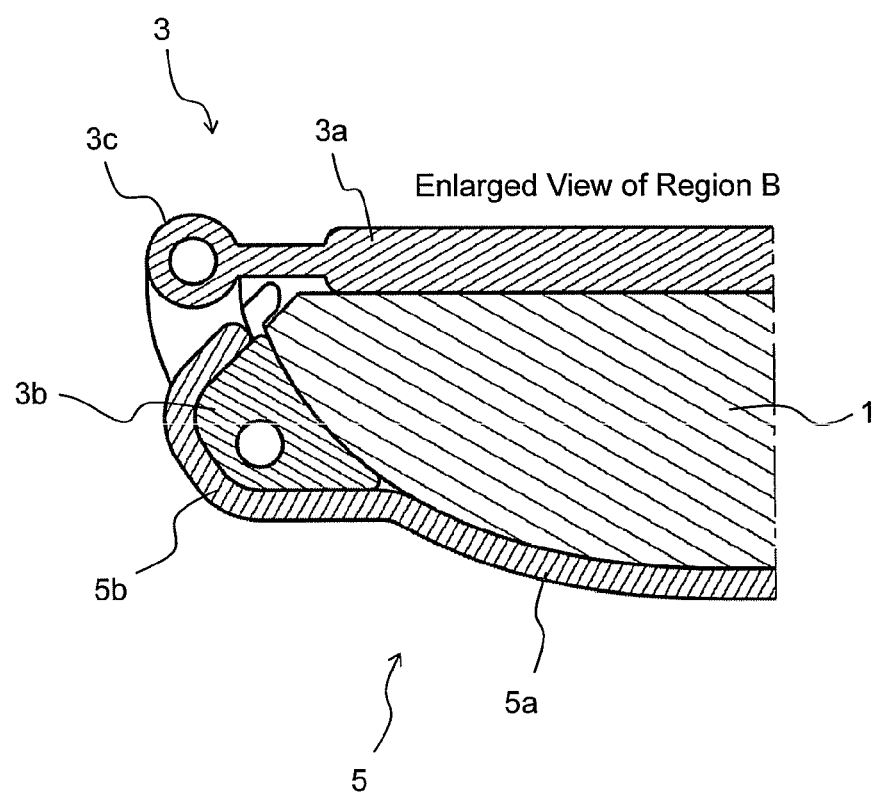
FIG. 3 is an enlarged view of region B in FIG. 2.

As shown in FIGS. 1 to 3, a touch-screen cover (e.g., "iPad Smart Cover") 3 is provided on a touch-screen side of a tablet device (e.g., "iPad2") 1. The touch-screen cover 3 is of a detachable type and comprises a main section 3a configured to cover a touch screen (not shown) of the tablet device 1 and an attaching/detaching section 3b configured to allow the touch-screen cover 3 to be detachably attached to the tablet device 1. The attaching/detaching section 3b has a built-in magnet and the attaching/detaching section 3b is fixed to a side surface of the tablet device 1 by means of magnetic force. The main section 3a is rotatable with respect to the attaching/detaching section 3b at a hinge portion 3c, so that the main section 3a can be opened and closed with the attaching/detaching section 3b fixed to the tablet device 1.

A back protective cover 5 is provided on a back side of the tablet device 1. The back protective cover 5 is of a detachable type and comprises a main section 5a configured to cover a back surface (and side surfaces) of the tablet device 1 and a separation preventing section 5b which extends from the main section 5a. The main section 5a can be fixed to the tablet device 1. The separation preventing section 5b is bent so as to surround the attaching/detaching section 3b and prevents the attaching/detaching section 3b from being separated from the tablet device 1. Therefore, by using the back protective cover 5 of this embodiment, the touch-screen cover 3 never comes off the tablet device 1 even if only the touch-screen cover 3 is lifted, and thus, the problem of falling of the tablet device 1 or the like can be prevented. Further, in a case of using a back protective cover without the separation preventing section 5b, a surrounding area of the attaching/detaching section 3b is exposed so that the tablet device 1 may be scratched in the area, however, by using the back protective cover 5 of this embodiment, which has the separation preventing section 5b, the surrounding area of the attaching/detaching section 3b is also covered by the back protective cover 5, and thereby the problem of scratching can be prevented.

The back protective cover 5 is preferably made of polycarbonate. With this material the back protective cover 5 can be transparent, so that a logo and the like provided on the back surface of the tablet device 1 can be visually recognized in a state where the back protective cover 5 is attached.

Description Of Numerals

1: tablet device, 3: touch-screen cover, 3*a*: main section of touch-screen cover, 3*b*: attaching/detaching section of touch-screen cover, 3*c*: hinge portion of touch-screen cover, 5: back protective cover, 5*a*: main section of back protective cover, 5*b*: separation preventing section of back protective cover

The invention claimed is:

1. A back protective cover which covers a back of a tablet device, comprising:
 a main section configured to cover a back of a tablet device; and
 a separation preventing section which extends from the main section,
 wherein the separation preventing section is configured to cover an attaching/detaching section of a touch-screen cover of a detachable type, the touch-screen cover covering a touch screen of the tablet device, so as to prevent separation between the touch-screen cover and the tablet device, and
 wherein the back protective cover is of a detachable type, and
 the back protective cover and the touch-screen cover are different members detachable from each other, and wherein the separation preventing section is bent so as to surround the attaching/detaching section such that the back protective cover must be detached from the touch screen cover prior to detaching the touch screen cover from the tablet device.

2. The back protective cover of claim 1, wherein the attaching/detaching section is provided on a side surface of the tablet device.

* * * * *